United States Patent [19]

Blakeslee et al.

[11] 4,062,698
[45] Dec. 13, 1977

[54] PHOTOELECTRICAL CONVERTER

[75] Inventors: A. Eugene Blakeslee, Mount Kisco; Harold John Hovel, Katonah, both of N.Y.

[73] Assignee: International Business Machines Corporation, Armonk, N.Y.

[21] Appl. No.: 738,519

[22] Filed: Nov. 3, 1976

[51] Int. Cl.² .............................. H01L 31/06
[52] U.S. Cl. .................... 136/89 PC; 136/89 CC; 136/89 SJ; 357/30; 357/80; 357/81
[58] Field of Search ............ 136/89 P, 89 PC, 89 CC, 136/89 SJ; 357/30, 80, 81

[56]  References Cited
U.S. PATENT DOCUMENTS
3,833,425  9/1974  Leinkram et al. ............... 136/89 PC
4,002,031  1/1977  Bell ........................ 60/641

OTHER PUBLICATIONS

L. W. James et al., "GaAs Concentrator Cells," *Conf. Record, 11th IEEE Photospecialists Conf.*, May 6-8, 1975, pp. 402-408.

*Primary Examiner*—John H. Mack
*Assistant Examiner*—Aaron Weisstuch
*Attorney, Agent, or Firm*—Alvin J. Riddles

[57]  ABSTRACT

Photoelectrical conversion cells may be assembled on an electrically conducting heat sink and each may be electrically isolated therefrom by employing insulating substrate material between the photoresponsive region of each cell and the heat sink.

12 Claims, 2 Drawing Figures

PHOTOELECTRICAL CONVERTER

BACKGROUND OF THE INVENTION

A photoelectrical conversion cell which produces an electrical current in response to hole-electron pairs produced by the light to which it is exposed, loses its efficiency as temperature increases, and since each cell provides only a small voltage increment, for significant voltage output it is necessary to have a number of cells in series. Thus it is necessary to bond the individual cells to a heat sink which is generally of an electrically conducting material and at the same time provide for electrical isolation of the individual cells from the heat sink. Generally in building series or series-parallel cell arrays with good thermal conductivity, complexity in structure and processing is encountered in also providing electrical isolation. One example of such a structure is shown in U.S. Pat. No. 3,833,425 where thermal conductivity is provided by attaching all the cells of the array to a large metal heat sink and electrical isolation is provided by individual cell isolators in the form of ceramic inserts.

SUMMARY OF THE INVENTION

The photoelectrical conversion cell of the invention employs a body of electrically insulating material having an active region integrally grown thereon containing a photoresponsive junction on one major surface thereof. The opposite major surface of the insulating material is suitable for thermal bonding to a heat sink, and the dimensional and electrical resistivity properties of the body of insulating material are adjusted for maximum thermal conductivity and minimum electrical leakage.

DETAILED DESCRIPTION

Figure 1:
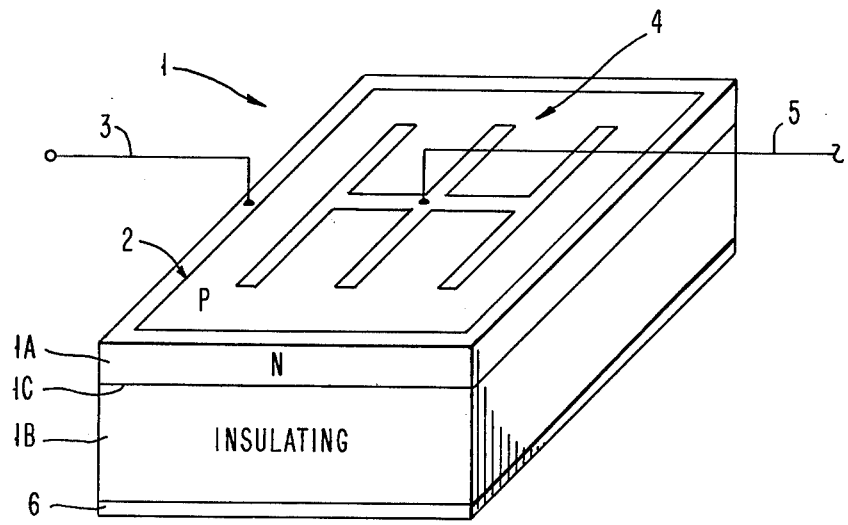
FIG. 1 is a view of the photoelectrical conversion device of the invention.

The photoelectric conversion cell is made up of a electrically insulating body having a photoresponsive junction parallel to the surface. The junction, labelled element 2, is illustrated as p-n junction that reaches the surface at a low resistance portion of the n region around the device periphery to which an external connection 3 is attached. This defines an active region 1A where hole-electron pairs produced by light striking the surface 4 produce current flow. The second external contact to the active region is shown as electrode 5. The electrode 5 is shown as a series of interconnected conducting lines covering a large area. The signal is developed between electrodes 3 and 5. The body 1 has an insulating portion 1B which thermally connects but electrically isolates the active region 1A from a heat sink member not shown, through a bond, shown as element 6. The bond is usually a low melting metal such as solder. The line shown as element 1C is used to differentiate the insulating portion from the extrinsic conductivity type portion of the body 1. It will be apparent to one skilled in the art that where the region 1A is defined by an impurity concentration the element 1C may not be a precise demarcation.

The material of the body 1 is to be such that an active region 1A may be formed at one surface, a thermal bond 6 formed on the opposite surface, and the thickness section 1B adjusted in accordance with the values of its electrical resistivity and thermal conductivity to provide desired electrical isolation and thermal transfer. Since the active region 1A is preferably a semiconductor, the insulating region 1B is usually made by causing the conductivity determining impurity content thereof to be such that the electrical performance of the material approaches that of an insulator.

The thickness dimension of the region 1B, for most semiconductor materials, to give the desired electrical performance, is smaller than the dimension required for a discrete insulator member that one could physically handle and hence maximum electrical and thermal advantage is gained. Further, since the photoelectric conversion cell of the invention is formed by semiconductor fabrication techniques such as diffusion and vapor deposition the precise control developed in the art is available in positioning the active region 1A so as to permit much nearer the maximum theoretically available thermal transfer for the electrical isolation desired than manual operations will permit.

The structure of FIG. 1 may be fabricated by growing epitaxially, using the technique of chemical vapor deposition well known in the art, an n conductivity type region of gallium arsenide (GaAs) on an insulating gallium arsenide (GaAs) body 1B. A p conductivity type region is then formed over most of the surface of the region 1A by diffusion of the appropriate type and concentration of conductivity type determining impurities, thereby forming a p-n junction 2. A low ohmic series resistance contact 3 is attached to the n conductivity type region. This is usually done by using a solder doped with an n conductivity type determining impurity. The electrode 5 is generally a grid pattern of ohmic contact material as shown. The bond 6 to the thermal element or heat sink may be made with a low melting material such as In, Sn, Pb or solder.

It will be apparent to one skilled in the art that the photoelectrically responsive junction in action region 1A may as an alternative to a conventional p-n junction may also involve a Schottky barrier or a heterojunction. A very high efficiency photoconversion cell for high solar concentrations using a gallium aluminum arsenide ($GaAl_xAs_{1-x}$) active layer grown on a conducting gallium arsenide layer which in turn has been grown on an insulating gallium arsenide (GaAs) region 1B may be formed in accordance with the invention. Another high efficiency photoconversion cell is formed when the active region consists of a gallium arsenide p-n junction covered by a layer of gallium aluminum arsenide. Alternately, the p-n junction could be formed in a layer of gallium aluminum arsenide.

The photoconversion device of FIG. 1 may be fabricated by vapor growing a 10-micron $n$ conductivity type GaAs region 1A on a 0.010 inch thick insulating GaAs region 1B substrate. A Cu or Au Schottky barrier is formed as element 2, in this case on the surface, and is equipped with electrode 5. The ohmic contact 3 to the $n$ conductivity type region is made with Au-Sn. A plated In layer is used for bonding at 6.

While the invention has been described involving a monocrystalline embodiment it will be apparent to one skilled in the art that polycrystalline materials may be employed so long as a sufficiently efficient active region can be formed and the crystal grain boundaries are controlled with respect to the prevention of electrical shorting to the electrically conducting heat sink.

In order to facilitate the practice of the invention the following examples of materials and thickness dimension for the region 1B for a typical given temperature for two types of concentrators is set forth, so that in the light of the teaching provided, one skilled in the art may apply the principles of the invention to various materials and processes for particular device applications.

In a typical application the insulating region 1B is grown of GaAs and an array of devices is utilized in a linear light conncentrator such as parabolic trough, the concentration of the light can be assumed to be about 100 times. The resistivity of the insulating GaAs is generally of the order of $10^8$ ohm-cm and hence the resistance of 10 mil wafer, 1cm$^2$ area would be $2.54 \times 10^6$ ohms.

In an array with 100 cells in series, each of 1cm$^2$ area, the last one would be about 100 volts above ground. The leakage in the cell highest above ground would be 100 volt/$2.54 \times 10^6$ $\Omega$ which is 39 microamperes for the 10 mil thick semi-insulating substrate. The primary current through the array for 100 $\times$ light concentration would be 25 milliamperes $\times$ 100 which is 2.5 amperes. It will be apparent that the leakage is negligible, and it would even be negligible if the semi-insulating GaAs were only 1 mil thick instead of 10 mil.

The effect upon cell operating temperature is as follows:

The temperature of the cell above the heat sink temperature is $$\Delta T = \frac{\text{Energy} \times \text{Thickness}}{\text{Area} \times \text{Thermal Conductance}} \quad \text{Equation 1}$$

For 10 mils of GaAs, $$\Delta T = (10 \text{ watts} \times 2.54 \times 10^{-2})/1\text{cm}^2 \times 0.54 = 0.47° \text{ C} \quad \text{(Eq. 2)}$$

This may be contrasted with glass.
For 10 mils of glass, $$\Delta T = (10 \times 2.54 \times 10^{-2})/1 \times 0.00837 = 30.3° \text{ C} \quad \text{(Eq. 3)}$$

Glass is chosen as an example because it is cheap.

In another application the insulating region 1B may be made of GaAs and used in 3-dimensional light focusing such as paraboloid where the light concentration is then about 1000 times. In this case the leakage current for cells 100 volts above ground would be 39$\mu$A, and the array current would be $1000 \times 25 \text{ } mA = 25$ amperes. In such a structure operation could be at 1000 volts with 1 mil semi-insulating GaAs and the leakage would still be negligible.

More importantly there is a temperature transfer advantage;

For GaAs, $$\Delta T_{GaAs} = (100 \text{ watts} \times 0.0254\text{cm})/1\text{cm}^2 \times 0.54 \text{ watts/cm° C} = 4.7° \text{ C} \quad \text{(Eq. 4)}$$

For glass, $$\Delta T_{Glass} = (100 \times 0.0254)/1\text{cm}^2 \times 0.00837 = 303° \text{ C} \quad \text{(Eq. 5)}$$

It will be apparent to one skilled in the art that with glass there is a severe disadvantage.

When a plurality of photoconversion cells are placed in series so that 0.5 to 1.0 volts developed across each is additive thereby producing a larger overall voltage output for the array, there will be an increasing electrical isolation requirement as the cell is farther from ground in the array.

Figure 2:
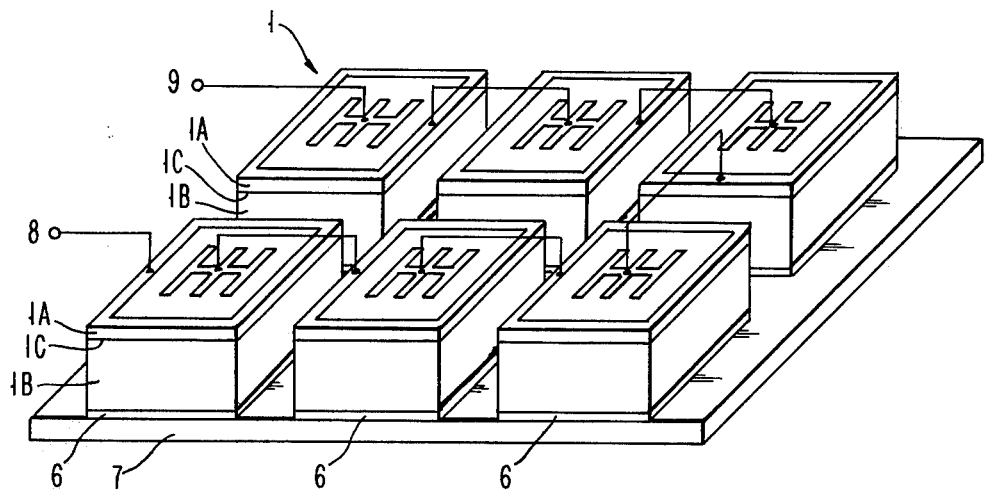
FIG. 2 is a view of an array of photoelectrical devices of the invention.

Referring next to FIG. 2 an array of devices is illustrated. The array is made up of a number of devices as shown in FIG. 1. Each is thermally bonded to a large heat sink member 7. Each device is connected in series so that the sum of all incremental voltage produced by each device appears between terminals 8 and 9. Each device is electrically isolated from the heat sink 7 by the insulating region 1B. It will be apparent that the scale is enlarged in the drawing and in fact the thickness dimension of region 1B is usually only slightly larger than that of the active region 1A. The magnitude of electrical isolation required and hence the minimum tolerable thickness dimension for the region 1B will increase as each sucessive series device operates at a point further from ground potential. The series paths may be repeated in parallel to add current capability.

An array of 15 devices in series assembled along the lines set forth in FIG. 2, where the devices are made in GaAs on insulating GaAs 0.010 inches thick will deliver 12 volts between terminals 8 and 9 and 25 milliamperes of current for each square centimeter of photoresponsive area. The electrical isolation provided between the device operating at 12 volts and the substrate 7 would be $2.5 \times 10^6$ ohms divided by the area of the device in square centimeters. This provides a leakage current of 4.8 microamperes per square decentimeter of device area. The significance of such a leakage current is reduced as the light intensity and hence total array output current is increased.

A technique has been set forth to employ the properties of an integral insulating material between the active region of a photoconversion device and a heat sink to both thermally conduct and electrically isolate.

What is claimed is:

1. A photoresponsive device comprising in combination a device body having first and second major parallel opposed surfaces, a photoresponsive active region comprising semiconductor material along said first major surface;

a region of electrically insulating material in each said device epitaxial with said active region and separating said active region from said second major surface;

a thermally absorbing member; and means bonding said second major surface to said thermally absorbing member.

2. The photoresponsive device of claim 1 wherein said photoresponsive active region includes a Schottky barrier.

3. The photoresponsive device of claim 2 wherein said Schottky barrier is copper on gallium arsenide.

4. The photoresponsive device of claim 2 wherein said Schottky barrier is gold on gallium arsenide.

5. The photoresponsive device of claim 1 wherein said photoresponsive active region includes a semiconductor p-n junction.

6. The photoresponsive device of claim 5 wherein said semiconductor is appropriately doped gallium arsenide and said insulating material is gallium arsenide with conductivity approaching that of an insulator.

7. The photoresponsive device of claim 5 wherein said semiconductor is gallium aluminum arsenide and said insulating material is gallium arsenide.

8. The photoresponsive device of claim 1 wherein said photoresponsive active region includes a semiconductor heterojunction.

9. The photoresponsive device of claim 8 wherein said semiconductor heterojunction is formed between gallium arsenide and gallium aluminum arsenide.

10. The photoresponsive device of claim 1 wherein said photoresponsive active region includes a gallium arsenide p-n junction covered by a layer of gallium aluminum arsenide.

11. A photoresponsive device comprising in combination a thermal absorbing member, a semiconductor body having a photoresponsive p-n junction parallel to the major surface thereof, a first electrode ohmically connected to a first conductivity type portion of said p-n junction, a second electrode ohmically connected to at least a portion of the second conductivity type portion of said p-n junction, an insulating region of said semiconductor body between said second conductivity type portion and said thermal absorbing member and operable to provide electrical isolation.

12. An array of photoresponsive devices comprising in combination a thermal absorbing member, a plurality of device bodies each having first and second major parallel opposed surfaces, a photoconversion active region parallel to a first major surface of each said device, a region of electrically insulating material in each said device body epitaxial with its said active region and separating its said active region from its said second major surface, means bonding said second major surface of each device body to said thermal absorbing member, means serially connecting groups of said photoconversion active regions to provide additive voltages and further means connecting serially-connected group pathways in parallel to provide additive currents.

* * * * *